(12) United States Patent
Cho et al.

(10) Patent No.: US 7,713,862 B2
(45) Date of Patent: May 11, 2010

(54) PRINTED WIRING BOARD AND METHOD FOR MANUFACTURING THE SAME

(75) Inventors: Hye Jin Cho, Kyungki-do (KR); Jae Woo Joung, Kyungki-do (KR); Sung Il Oh, Seoul (KR)

(73) Assignee: Samsung Electro-Mechanics Co., Ltd, Suwon (KR)

( * ) Notice: Subject to any disclaimer, the term of this patent is extended or adjusted under 35 U.S.C. 154(b) by 394 days.

(21) Appl. No.: 11/634,970

(22) Filed: Dec. 7, 2006

(65) Prior Publication Data

US 2007/0128855 A1   Jun. 7, 2007

(30) Foreign Application Priority Data

Dec. 7, 2005   (KR) ...................... 10-2005-0118596

(51) Int. Cl.
   *H01L 21/4763* (2006.01)
(52) U.S. Cl. ...................... 438/622; 438/618; 438/620; 438/E23.167
(58) Field of Classification Search .................. None
   See application file for complete search history.

(56) References Cited

U.S. PATENT DOCUMENTS 6,010,956 A * 1/2000 Takiguchi et al. ........... 438/623

2003/0213614 A1 * 11/2003 Furusawa et al. ........... 174/256

FOREIGN PATENT DOCUMENTS

| JP | 11-163499 | 6/1999 |
|----|-----------|--------|
| JP | 2004-241514 | 8/2004 |
| JP | 2004-266132 | 9/2004 |
| JP | 2005-210079 | 8/2005 |

OTHER PUBLICATIONS

Japanese Office Action issued on Apr. 7, 2009 in corresponding Japanese patent application No. 2006-331065.
Japanese Office Action issued on Oct. 13, 2009 in corresponding Japanese Patent Application 2006-331065.

* cited by examiner

*Primary Examiner*—Dung A. Le

(57) ABSTRACT

Provided is a method for manufacturing a printed wiring board, which can enhance the peel strength between an insulating layer and a conductive pattern by a two-step process, that is, a semi-hardening and full-hardening of the insulating layer. In the method for manufacturing the printed wiring board having one or more layers of a conductive pattern and an insulating pattern, an insulating pattern is formed on an insulating substrate, and at least one of the insulating substrate and the insulating pattern is semi-hardened. A conductive pattern is formed on the insulating substrate and/or the insulating pattern, thereby providing a stack structure. Then, a thermal treatment is performed on the stack structure to fully harden the semi-hardened insulating substrate and/or insulating pattern, and the conductive pattern is fired.

14 Claims, 2 Drawing Sheets

(a) Formation of insulating substrate (b) Semi-hardening of insulating substrate (c) Formation of first conductive pattern (d) Formation of interlayer conductive layer (e) Formation of insulating pattern (f) Thermal treatment for hardening insulating substrate and insulating pattern and firing conductive pattern (a) Formation of insulating substrate

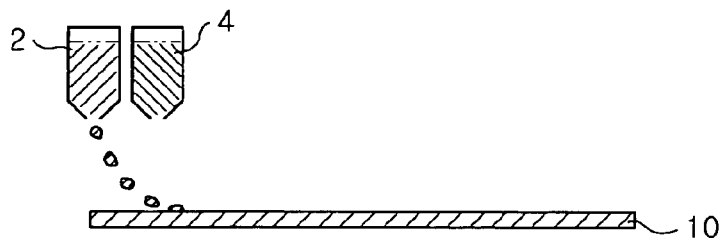

(b) Semi-hardening of insulating substrate

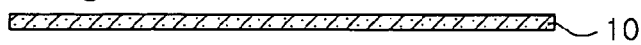

(c) Simultaneous formation of first insualting pattern and first conductive pattern

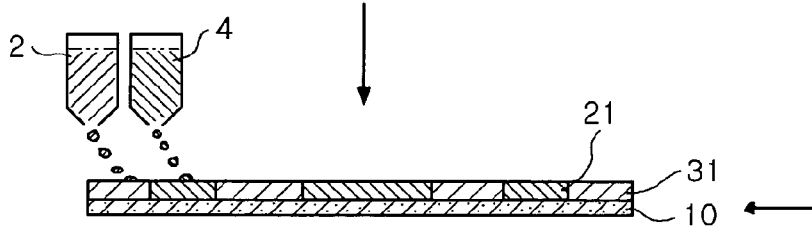

(d) Semi-hardening of first insulating pattern

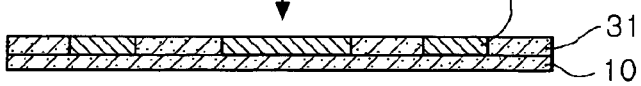

(e) Simultaneous formation of second insulating pattern and second conductive pattern

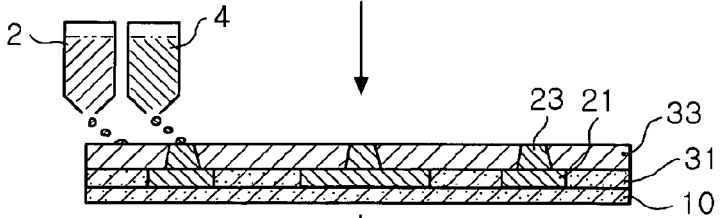

(f) Thermal treatment for fully hardening insulating substrate and insulating pattern and firing conductive pattern e1 → Semi-hardening of second insulating pattern

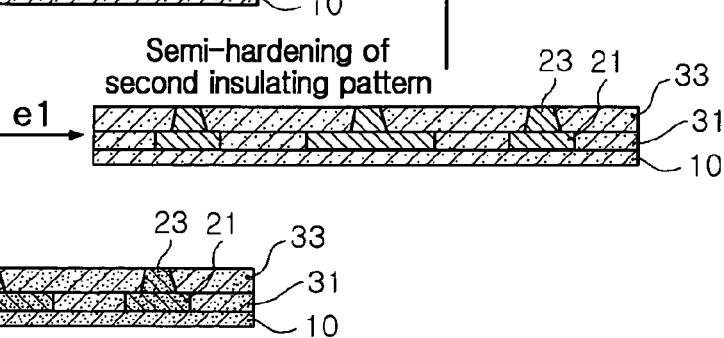

FIG. 2

PRINTED WIRING BOARD AND METHOD FOR MANUFACTURING THE SAME

RELATED APPLICATION

The present application is based on, and claims priority from, Korean Application Number 2005-118596, filed on Dec. 7, 2005, the disclosure of which is hereby incorporated by reference herein in its entirety.

BACKGROUND OF THE INVENTION

1. Field of the Invention

The present invention relates to a method for manufacturing a printed wiring board, in which a wiring pattern is formed using an inkjet process, and more particularly, to a method for manufacturing a printed wiring board, which can enhance the peel strength between an insulating layer and a conductive pattern by a two-step process, that is, a semi-hardening and full-hardening of the insulating layer.

2. Description of the Related Art

In the electronic devices, computers, communication devices, and so on, semiconductors or electronic components are mounted on a printed wiring board. Circuit patterns (conductive patterns) of the printed wiring board are highly densified by the miniaturization of the devices or high performance of the semiconductors.

Generally, the circuit patterns of the printed wiring board are formed using a subtractive process. In the subtractive process, the circuit patterns are formed using an electroless plating process, a patterning process, an electrolyte plating process, and an etching process. The subtractive process, however, is complex and presents a problem of having to dispose of waste liquid during the plating process or the etching process.

To solve this problem, techniques have been developed which form a conductive pattern and an insulating pattern on a surface of a substrate using an inkjet process. If the wiring pattern (insulating pattern/conductive pattern) is formed using the inkjet process, circuit width or pitch can be reduced and multi-layer architecture can be easily implemented. A method for forming the wiring pattern using the inkjet process is disclosed in Japanese Laid-Open Patent Publication Nos. 1999-163499 and 2005-210079.

According to Japanese Laid-Open Patent Publication No. 1999-163499, a printed wiring board is manufactured by simultaneously printing a conductive pattern and an insulating pattern, whose thickness is identical to that of the conductive pattern, on an insulating substrate using an inkjet process.

According to Japanese Laid-Open Patent Publication No. 2005-210079, an insulating pattern is formed an insulating substrate and a conducive pattern is then formed. Then, a multi-layered printed wiring board is manufactured by repeating the two steps. Specifically, the conductive pattern and the insulating pattern are printed on a polyimide film, and the insulating pattern is fully hardened by heating or infrared lamp. Then, the conductive pattern is formed on the hardened insulating pattern and is heated (fired).

The above-described conventional methods have a problem in that the peel strength between the insulating layer and the conductive layer is low because the conductive pattern is printed on the fully hardened insulating layer (insulating substrate or insulating pattern) and is fired, the peel strength between the insulating layer and the conductive layer is low.

SUMMARY OF THE INVENTION

Accordingly, the present invention is directed to a printed wiring board and a method for manufacturing the same that substantially obviates one or more problems due to limitations and disadvantages of the related art.

An object of the present invention is to provide a printed wiring board and a method for manufacturing the same, which can increase the peel strength between a conductive pattern and an insulating patter. Furthermore, by forming an insulating substrate using an inkjet process, the peel strength between an insulating substrate and a conductive layer formed thereon and between an insulating pattern and a conductive pattern formed thereon can be improved, thereby increasing the peel strength over the entire printed wiring board.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for manufacturing a printed wiring board having one or more layers of a conductive pattern and an insulating pattern includes the step of: forming an insulating pattern on an insulating substrate; semi-hardening at least one of the insulating substrate and the insulating pattern; forming a conductive pattern on the insulating substrate and/or the insulating pattern, thereby providing a stack structure; performing a thermal treatment on the stack structure to fully harden the semi-hardened insulating substrate and/or insulating pattern; and firing the conductive pattern.

The conductive pattern and the insulating pattern may be formed using an inkjet process. In addition, the insulating substrate may be a film substrate, a sheet substrate, or a plate substrate, which has an insulating property. The insulating substrate is not a hardened insulating substrate, and may be formed using an inkjet process.

The conductive pattern and the semi-hardened insulating pattern may be simultaneously formed, thereby increasing the peel strength therebetween. Therefore, the present invention can be applied to the multi-layered printed wiring board as well as the single-layered printed wiring board. The printed wiring board is preferably formed using an inkjet processing, but is not limited thereto. Also, the insulating substrate may be formed of a film substrate, but the printed wiring board may be manufactured while forming the insulating substrate using an inkjet printing process.

According to another aspect of the present invention, a method for manufacturing a printed wiring board includes the steps of: (a) printing an insulating ink using an inkjet process to form an insulating substrate; (b) semi-hardening the insulating ink; (c) printing a conductive ink on the semi-hardened insulating substrate along a wiring pattern by an inkjet process, thereby forming a first conductive pattern; (d) printing a conductive ink on a partial upper portion of the first conductive pattern by an inkjet process, thereby forming an interlayer conductive layer; (e) printing an insulating ink on the insulating substrate and the first conductive pattern along a wiring pattern by an inkjet process, thereby forming an insulating pattern; and (f) performing a thermal treatment to harden the insulating ink and fire the conductive ink.

According to a further aspect of the present invention, a method for manufacturing a printed wiring board includes the steps of: (a) printing an insulating ink using an inkjet process to form an insulating substrate; (b) semi-hardening the insulating ink; (c) printing a conductive ink and an insulating ink on the semi-hardened insulating substrate along a wiring pattern by an inkjet process, thereby forming a first conductive pattern and a first insulating pattern; (d) semi-hardening the first insulating pattern; (e) printing a conductive ink and an insulating ink on the first conductive pattern and the first insulating pattern along a wiring pattern by an inkjet process, thereby forming a second insulating pattern and a second conducive pattern acting as an interlayer conducive layer; and (f) performing a thermal treatment to harden the insulating ink and fire the conductive ink.

The method may further include the steps of: semi-hardening the second insulating pattern after the step (e);

and repeating the steps (c) to (e) more than one time, thereby forming a multi-layered circuit.

Preferably, the insulating layer (insulating substrate or insulating pattern) can be semi-hardened by ultraviolet (UV) irradiation. Prior to the semi-hardening, it is preferable that the method further includes the step of volatilizing a solvent from the insulating ink. It is preferable that the drying temperature is below 150° C.

In addition to an insulating resin and photo-polymerization initiator, a crosslinking agent may be contained in the insulating ink. The insulating resin may be polyimide or polyimide precursor. When the polyimide precursor is used, the insulating ink may be a 3-component system consisting of polyamic acid, photo-polymerization initiator, and crosslinking agent. For example, the polyamic acid is 50-60 wt %, the crosslinking agent is 21-35 wt %, and the photo-polymerization agent is 5-29 wt %.

In addition, the insulating ink may be a 2-component system consisting of bismaleimide based compound and photo-polymerization initiator. For example, the bismaleimide based compound is 85-95 wt % and the photo-polymerization initiator is 5-15 wt %.

The conductive pattern may include at least one metal selected from the group consisting of gold, silver, copper, platinum, chrome, nickel, aluminum, titan, palladium, tin, vanadium, zinc, manganese, cobalt, zirconium, and alloys thereof.

In order to fully harden the insulating layer and firing the conductive layer, the thermal treatment may be performed at 200-400° C., more preferably 200-350° C. In the printed wiring board of the present invention, the semi-hardened insulating layer is hardened and the conductive pattern is fired by performing the thermal treatment on the insulating layer and the conductive pattern at the same time, thereby increasing the peel strength therebetween.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 2(a) to 2(f) are sectional views illustrating a method for manufacturing a printed wiring board according to another embodiment of the present invention, in which a conductive pattern and an insulating pattern are simultaneously formed using an inkjet process.

DETAILED DESCRIPTION OF THE INVENTION

Figure 1:
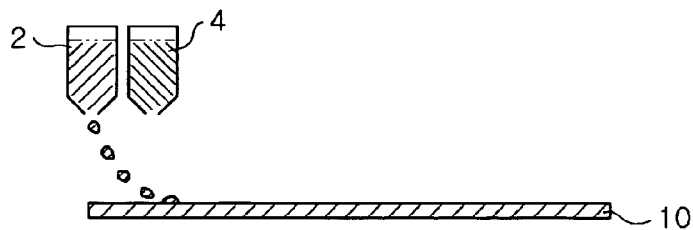
FIGS. 1(a) to 1(f) are sectional views illustrating a method for fabricating a printed wiring board according to an embodiment of the present invention, in which a conductive pattern and an insulating pattern are sequentially formed using an inkjet process.
Figure 1:
Figure 1:
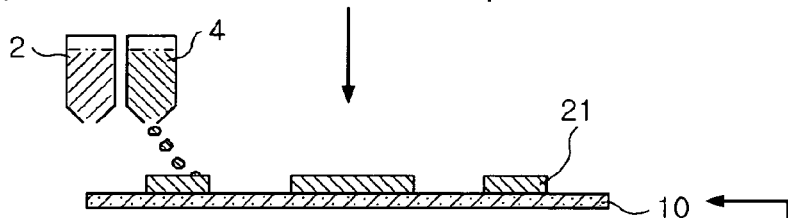
Figure 1:
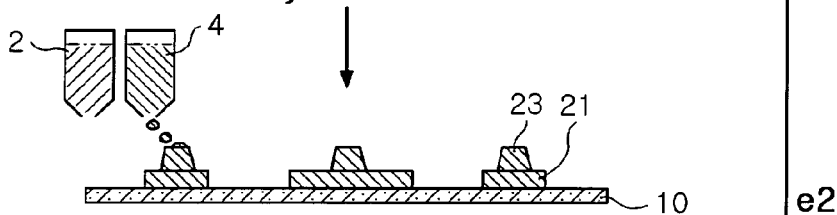
Figure 1:
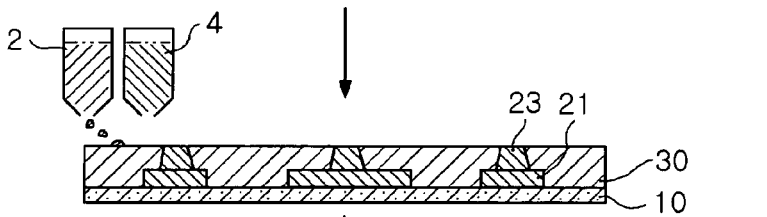
Figure 1:
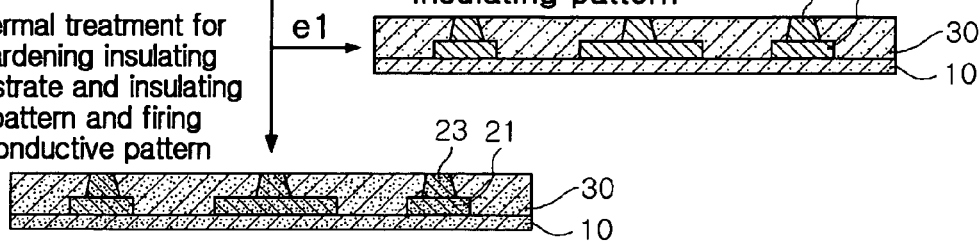

Reference will now be made in detail to the preferred embodiments of the present invention, examples of which are illustrated in the accompanying drawings.

In the following description, an insulating substrate may be a flat substrate such as a film, sheet, and plate and, if an inkjet can be applied, a curved substrate. A conductive pattern means a circuit pattern, and an insulating patterns means a portion except for the circuit pattern. A wiring pattern includes the conductive pattern and the insulating pattern. An interlayer conductive layer electrically connects the upper conductive pattern and the lower conductive pattern, and has the same effect as a through hole or via hole. The insulating substrate and the insulating pattern may be referred to as an insulating layer.

While attempting to increase the peel strength between the insulating layer and the conductive pattern, we knew that the conductive ink is more adhesive to the semi-hardened insulating layer rather than the fully-hardened insulating layer. In addition, if the thermal treatment is performed on the semi-hardened insulating layer and the conductive pattern printed thereon simultaneously, the conductive pattern is fired while the semi-hardened insulating layer is fully hardened. Therefore, the adherence is improved.

According to the present invention, the insulating layer is semi-hardened and the conductive pattern is formed on the semi-hardened insulating layer. Then, the thermal treatment is performed on the insulating layer and the conductive pattern at the same time. The present invention can be applied to a single-sided printed wiring board, a double-sided printed wiring board, and a multi-layered printed wiring board. In addition, the present invention can be applied to the methods for forming the insulating patterns sequentially or simultaneously. Preferably, the present invention is applied to the method for manufacturing the printed circuit board using the inkjet printing. However, the present invention can also be applied to any printing methods for increasing the peel strength between the insulating layer and the conductive pattern.

According to the present invention, a method for manufacturing a printed wiring board having one or more layers of a conductive pattern and an insulating pattern includes the step of: forming an insulating pattern on an insulating substrate; semi-hardening at least one of the insulating substrate and the insulating pattern; forming a conductive pattern on the insulating substrate and/or the insulating pattern, thereby providing a stack structure; performing a thermal treatment on the stack structure to fully harden the semi-hardened insulating substrate and/or insulating pattern; and firing the conductive pattern.

The insulating substrate may be a film substrate, a sheet substrate, or a plate substrate, which has an insulating property. The insulating substrate is not a fully-hardened insulating substrate, but the conductive pattern and the insulating pattern are formed while forming the insulating substrate using the printing process. The conductive pattern and the insulating pattern can be simultaneously formed on the same layer using the inkjet process.

The semi-hardening can be applied using a heat source or light irradiation. A drying process of below about 150° C. may be further performed to volatilize a solvent from the insulating ink before the semi-hardening.

The insulating substrate and the insulating pattern are formed of an insulating ink by an inkjet process. The insulating ink may be a 3-component system consisting of 50-60 wt % of polyamic acid, 5-29 wt % of photo-polymerization initiator, and 21-35 wt % of crosslinking agent.

In addition, the insulating ink may be a 2-component system consisting of 85-95 wt % of bismaleimide based compound and 5-15 wt % of photo-polymerization initiator.

The conductive pattern is formed of a conductive ink by an inkjet process and includes at least one metal selected from the group consisting of gold, silver, copper, platinum, chrome, nickel, aluminum, titan, palladium, tin, vanadium, zinc, manganese, cobalt, zirconium, and alloys thereof.

In order to fully harden the insulating layer and fire the conductive layer, the thermal treatment may be performed at 200-400° C., more preferably 200-350° C. It is preferable that the full-hardening temperature of the insulating substrate is below 350° C.

FIGS. 1(a) to 1(f) are sectional views illustrating the sequential formation of a conductive pattern and an insulating pattern according to an embodiment of the present invention. In FIGS. 1(a) to 1(f), reference numerals 2 and 4 represent an insulating ink head and a conductive ink head, respectively.

Referring to FIG. 1(a), an insulating substrate 10 is formed by printing an insulating ink using an inject process.

The printing using the inkjet process can employ a proper injection method, depending on patterns or kinds of ink. Examples of the injection method include a piezoelectric method, a bubble jet method, an electrostatic induction method, and a continuous injection method.

Referring to FIG. 1(b), the insulating substrate 10 is semi-hardened. The semi-hardening is achieved by a direct heating or indirect heating. The indirect heating is a kind of light irradiation, preferably an ultraviolet (UV) irradiation. The UV irradiation can achieve a momentary semi-hardening and a selective semi-hardening. That is, when a conductive pattern and an insulating pattern coexist or is multi-layered in a subsequent process, the heat may be applied to the lower conductive pattern or the lower insulating pattern during the semi-hardening process using a heat source.

Referring to FIG. 1(c), a conductive ink is printed on the semi-hardened insulating substrate 10 along a wiring pattern by an inkjet process, thereby forming a first conductive pattern 21. The printed circuit width can correspond to any dimensions that are currently produced. The inkjet process can exhibit excellent productivity with respect to circuits having a narrow circuit width and a complex structure. The present invention can be applied to a printed wiring board with a circuit width of 25-100 µm, but is not limited thereto. In addition, the present invention can be applied to a printed wiring board with a circuit thickness corresponding to a level of a copper foil, preferably 5020 µm, but is not limited thereto.

Referring to FIG. 1(d), a conductive ink is printed on a partial upper portion of the first conductive pattern 21 along the conductive pattern by an inkjet process, thereby forming an interlayer conductive layer 23. The interlayer conductive layer 23 is used to electrically connect the wirings. The interlayer conductive layer 23 is formed at a location corresponding to a through hole or via hole of the conventional multi-layered printed wiring board.

Referring to FIG. 1(e), an insulating pattern 30 is formed on the insulating substrate 10 and the first conductive pattern 21 along the wiring pattern, thereby providing a stack structure.

Referring to FIG. 1(f), a heat treatment is performed on the stack structure to fully harden the insulating pattern 21. Simultaneously, the first conductive pattern 21 and the interlayer conductive layer 23 are fired to thereby manufacture a single-layered printed wiring board.

A multi-layered printed wiring board according to the present invention can be manufactured by semi-hardening the insulating pattern 30 in steps (e) and (e1) of FIG. 1, repeating steps (c) to (e) indicated by step (e2), and performing step (f).

FIGS. 2(a) to 2(f) are sectional views illustrating the simultaneous formation of a conductive pattern and an insulating pattern according to another embodiment of the present invention. The manufacturing method of FIGS. 2(a) to 2(f) is similar to that of FIGS. 1(a) to 1(f) and the duplicate description will be omitted.

Referring to FIG. 2(a), an insulating substrate 10 is formed by printing an insulating ink using an inject process.

Referring to FIG. 2(b), the insulating substrate 10 is semi-hardened.

Referring to FIG. 2(c), a conductive ink and an insulating ink are printed on the semi-hardened insulating substrate 10 along a wiring pattern by an inkjet process, thereby forming a first conductive pattern 21 and a first insulating pattern 31.

Referring to FIG. 2(d), the first insulating pattern 31 is semi-hardened.

Referring to FIG. 2(e), a conductive ink and an insulating ink are printed on the semi-hardened first insulating pattern 31 and the first conductive pattern along the wiring pattern by an inkjet process, thereby forming a second insulating pattern 33 and a second conductive pattern 23 serving as an interlayer conducive layer. Consequently, a stack structure is provided.

Referring to FIG. 2(f), a heat treatment is performed on the stack structure to fully harden the insulating substrate and the insulating patterns 31 and 33. Simultaneously, the first conductive pattern 21 and the second conductive layer 23 are fired to thereby manufacture a single-layered printed wiring board.

A multi-layered printed wiring board according to the present invention can be manufactured by semi-hardening the insulating pattern 30 in step (e1) of FIG. 1, repeating steps (c) to (e) indicated by step (e2), and performing step (f).

The manufacturing method according to the present invention may further include the step of drying the insulating layer before semi-hardening the insulating layer (insulating substrate or insulating pattern). The drying step is to volatilize a solvent from the insulating ink, and is preferably performed at below about 150° C. The drying step may be skipped if the printed insulating pattern can be maintained because the viscosity of the insulating ink is high.

The method for manufacturing the printed wiring board, the insulating ink, and the conductive ink will be described below in detail. The insulating ink and the conductive ink are inks used in the manufacture of the printed wiring board using the inkjet process. Meanwhile, when the semi-hardening of the insulating ink is achieved using UV rays, photo-polymerization initiator has to be added to the insulating ink.

The insulating ink must effectively insulate a plurality of circuit layers printed with the conductive ink and have the adherence with the circuit or substrate. The insulating ink means a material in which an insulating material is uniformly dissolved in a solvent. A material that is generally used for forming the insulating layer can be used as the insulating ink. Any materials can be used if the materials can be printed by the inkjet process and hardened at a firing temperature of the conductive layer. Considering these aspects, acrylate resin, phenol resin, epoxy resin, and polyimide resin can be used. In addition, inorganic filler may be fixed in the insulating ink in order to enhance heat resistance or thermal expansion characteristic. In the case where the insulating substrate or the insulating pattern is semi-hardened using the UV irradiation, photo-polymerization initiator for photo-polymerization reaction is added. Examples of the resin that can be semi-hardened include epoxy resin, acryl resin, phenol resin, melamine resin, polyimide resin, and bismaleimide based compound.

According to the present invention, the insulating ink may further contain a crosslinking agent, in addition to the insulating resin and the photo-polymerization initiator. The insulating resin may use polyimide or polyimide precursor. In the case of using the polyimide precursor, the insulating ink may be a 3-component system consisting of polyamic acid (50-60 wt %), photo-polymerization initiator (21-35 wt %), and crosslinking agent (5-29 w %). In addition, the insulating ink may be a 2-component system consisting of bismaleimide based compound (85-95 wt %) and photo-polymerization initiator (5-15 wt %).

The photo-polymerization initiator may be onium salt, sulfate ester, or sulfonyl compound. The onium salt may be diphenyl-onium or tri-phenyl-sulfonium salt, and the sulfate ester may be o-retro-benzyl ester. The sulfonyl compound may be a,a'-bis-acryl-sulfonyl diazomethane.

The crosslinking agent may be melamine derivative, for example, N-methoxy-methylate melamine.

In the inkjet printing process, the insulating ink widely uses polyimide or polyamic acid (PAA), which is the polyimide precursor. The polyimide has a problem in that bubbles or pores are generated because $H_2O$ is formed during the dehydration reaction of chain, while the polyimide is being hardened. In addition, since the polyamic acid has a relatively high viscosity, it must be diluted with a large amount of solvent in order to reduce the viscosity of the polyamic acid. Furthermore, when the insulating layer is formed of the diluted polyamic acid and is hardened, a large amount of solvent is volatilized and thus pores may be formed in the insulating layer. The thickness of the insulating layer may be significantly reduced. To solve these problems, it is preferable to use the insulating ink containing bismaleimide based compound. This compound can directly form a three-dimensional mesh structure without additionally forming volatile material due to heat after it becomes polyimide. In the case of using the bismaleimide based compound, a compound having a low molecular weight can be used and thus the viscosity of the insulating ink can be easily reduced. Therefore, the case of using the bismaleimide based compound can provide the insulating ink containing more insulating material than the case of using the polyamic acid. In addition, when the bismaleimide compound is adhered to the conductive layer, high wettability and adhesiveness can be expected. Moreover, since the bismaleimide compound is not almost deformed during the hardening process, the insulating layer having high dimensional stability can be formed.

When the insulating layer is formed of the bismaleimide based compound, the hardening reaction occurs at a temperature of 200-250° C. and thus this case can be applied to the process requiring a low temperature hardening. Preferably, the conductive pattern is fired at a low temperature. Therefore, the application of the bismaleimide based compound is suitable for a simultaneous thermal treatment of the conductive pattern and the insulating layer.

A typical bismaleimide based compound is aromatic or aliphatic bismaleimide. Most preferably, 1,1'-(methylene-di-4,1-phenylene)bismaleimide can be used. This compound is hardened at about 200° C. Bismaleimide can achieve the crosslinking by hardening, without any crosslinking agent. Accordingly, the insulating layer having low permittivity and high heat resistance can be obtained.

The solvent for dissolving the insulating material may be changed, depending on kinds of the insulating material used. For example, the solvent may be one selected from the group consisting of methyl ethyl ketone (MEK), dimethyl formamide (DMF), methyl cellusolve (MCS), and mixed solutions thereof. The viscosity of the insulating ink is 1-50 cps, preferably 5-20 cps.

When the insulating substrate or insulating pattern is printed using the inkjet process, other insulating inks may be used, but it is preferable to use the same insulating ink.

The conductive ink used in the present invention is an ink in which metal particles are uniformly dissociated in an organic solvent. In order to form fine wirings, it is preferable that the metal particles have a nano size. The wiring forming method using the conductive ink can be used without limitation. For example, the metal particles may be one selected from the group consisting of gold, silver, copper, platinum, chrome, nickel, aluminum, titan, palladium, tin, vanadium, zinc, manganese, cobalt, zirconium, and iron, but is not limited thereto. Among them, gold, silver, copper, and nickel are preferably used because they have excellent conductivity. Alternatively, the alloy of at least two components may be used. Silver is particularly preferable in economic terms. In order to form fine wirings of less than a few tens μm, it is preferable to use metal nano particles of 5-50 nm in size.

In addition, in order to dissociate the metal particles in the solvent uniformly and stably, capping molecules are required for surrounding the metal particles. There is no limitation to the capping molecules. For example, the capping molecules may be nitrogen or oxygen that can be coordinate-covalent-bonded with the metal particles, or compounds having chemical group with lone pair electrons of sulfur atoms. More specifically, the capping molecules may be one selected from the group consisting of amino group (—$NH_2$) containing nitrogen atom, sulfonyl group (—S—) containing sulfur atom, thiol group (—SH), hydroxyl group (—OH), and oxy group (—O—) (eter).

The solvent used to form the conducive ink may be aqueous or non-aqueous solvent, depending on properties of metal particles, but is not limited thereto. For example, the non-aqueous solvent may be one selected from the group consisting of toluene, tetradecane, and mixed solution thereof. The aqueous solvent may be one selected from the group consisting of water, diethylene glycol butyl ether acetate, ethanol aqueous solution, and mixed solution thereof. The metal particles are placed in the solution and dispersed using a sonicator. In this way, the conductive ink is prepared.

The preferred viscosity of the conductive ink suitable for printing the fine wirings is determined according to a condition of a nozzle, a printing condition, and a size of nano particle. The viscosity of the conductive ink is preferably 1-50 cps, more preferably 5-20 cps.

In the conductive ink, the conducive material is dispersed in aqueous solvent or oil solvent, and an additive such as a dispersing agent is mixed. The conductive ink with the metal nano particles can form the a fine wiring pattern with high line width precision. Also, the conductive pattern can be easily formed by firing the coating layer formed of the metal nano particles.

Hereinafter, the embodiments of the present invention will be described in more detail.

Embodiment 1

Silver nitride and PVP (MW=10,000) were mixed at a mole ratio of 1:8, and dimethyl formamide (DMF) was added as a reducing agent to a purified water at a volume ratio of 1:1. Then, the reaction was conducted at 100° C. for 30 minutes. Consequently, the conductive ink with 50-nm silver nano particles caped with PVP was prepared.

The insulating ink was prepared by mixing polyimide precursor, photo-polymerization initiator, and crosslinking agent, as shown in Table 1 below. In Table 1, PAA represents polyamic acid that is the polyimide precursor, MBHP (4,4'-methylenebis[2,6-bis(hydroxymthyl)]phenol) was used as the crosslinking agent. PTMA(5-propylsulfonly-oxyimino-5H-thiophen-2-ylidene)-2-(methylphenyl)-acetonitrile) was used as the photo-polymerization initiator.

As shown in FIGS. 1(a) and 1(b), the insulating substrate was formed by printing the insulating ink using the inkjet process and then was dried at 100° C., and was semi-hardened by irradiating UV rays. As shown in FIGS. 1(c) and 1(d), the first conductive pattern was formed by printing the conductive ink using the inkjet process, and the interlayer conductive layer was formed on the first conductive pattern using the inkjet process. Then, as shown in FIG. 1(e), the 5-μm insulating layer was formed by the insulating ink and was dried at 100° C., thereby obtaining the stack structure. Then, the stack structure was fired at 200° C. for 1 hour.

The hardening of the insulating layer was checked by the development in a water-soluble TMAH solution. The hardening can be determined from dissolution and non-dissolution.

TABLE 1

| | Classification | | |
|---|---|---|---|
| | A1 | A2 | A3 |
| Polyimide precursor | 70 wt % | 65 wt % | 60 wt % |
| Crosslinking agent | 20 wt % | 25 wt % | 30 wt % |
| Photo-polymerization initiator | 10 wt % | 10 wt % | 10 wt % |
| Experimental results | Dissolution | Non-dissolution | Non-dissolution |

As shown in Table 1, when the crosslinking agent is 20 wt % and thus is insufficient, the insulating layer was not fully hardened. Meanwhile, in the cases A2 and A3, the peel strength between the insulating layer and the conductive pattern was improved. Since a method for evaluating the peel strength between the insulating layer and the conductive layer is not established, the peel strength cannot be evaluated quantitatively.

Embodiment 2

Silver nitride and PVP (MW=10,000) were mixed at a mole ratio of 1:8, and dimethyl formamide (DMF) was added as a reducing agent to a purified water at a volume ratio of 1:1. Then, the reaction was conducted at 100° C. for 30 minutes. Consequently, the conductive ink with 50-nm silver nano particles caped with PVP was prepared.

1,1'-(methylene-di-4,1-phenylene)bismaleimide was dissolved in the mixed solution of methyl ethyl ketone (MEK) and dimethyl formamide (DMF) and thus the insulating ink of 15 cps was obtained. PTMA (5-propylsulfonyl-oxyimino-5H-thiophen-2-ylidene)-2-(methylphenyl)-acetonitrile) was used as the photo-polymerization initiator.

As shown in FIGS. 2(a) and 2(b), the insulating substrate was formed by printing the insulating ink using the inkjet process and then was dried at 100° C., and was semi-hardened by irradiating UV rays. As shown in FIG. 2(c), the first conductive pattern and the first insulating pattern were formed by printing the conductive ink and the insulating ink using the inkjet process. As shown in FIG. 2(d), the first insulating pattern was dried at 100° C. and semi-hardened by irradiating UV rays. Then, as shown in FIG. 2(e), the second insulating pattern and the second conductive pattern were formed by printing the insulating ink and the conductive ink on the first conductive pattern and the first insulating pattern. The resulting stack structure was fired at 200° C. for 1 hour.

The hardening of the insulating layer was checked by the development in a water-soluble TMAH solution. As the checking result, the development did not occur in the water-soluble TMAH solution. Also, it could be seen that the peel strength between the insulating layer and the conductive pattern was increased.

Although the UV irradiation is used as the semi-hardening means in the embodiments of the present invention, any methods that can semi-harden the insulating layer is applicable.

According to the present invention, the conductive pattern is formed on the semi-hardened insulating layer, and the thermal treatment is simultaneously performed on the insulating layer and the conductive pattern, thereby increasing the peel strength therebetween.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a printed wiring board having one or more layers of a conductive pattern and an insulating pattern, comprising:
   forming a first insulating pattern on an insulating substrate;
   semi-hardening at least one of the insulating substrate and the first insulating pattern;
   forming a conductive pattern on the insulating substrate and/or the first insulating pattern, thereby providing a stack structure;
   forming a second insulating pattern on the conductive pattern;
   performing a thermal treatment on the stack structure to fully harden the semi-hardened insulating substrate, the first insulating pattern and/or the second insulating pattern; and
   firing the conductive pattern,
   wherein the height of the second insulating pattern is the same as the height of the conductive pattern or higher than the height of the conductive pattern, and
   the insulating ink is a 2-component system consisting of 85-95 wt % of bismaleimide based compound and 5-15 wt % of photo-polymerization initiator.

2. The method of claim 1, wherein at least one of the insulating substrate, the conductive pattern, the first insulating pattern and the second insulating pattern is formed using an inkjet process.

3. The method of claim 1, wherein the semi-hardening is performed by ultraviolet (UV) irradiation.

4. The method of claim 3, further comprising performing a drying process before the semi-hardening.

5. The method of claim 1, wherein the thermal treatment is performed at 200-350° C.

6. A method for manufacturing a printed wiring board, comprising:
   printing an insulating ink using an inkjet process to form an insulating substrate;
   semi-hardening the insulating ink;
   printing a conductive ink on the semi-hardened insulating substrate along a wiring pattern by an inkjet process, thereby forming a first conductive pattern;
   printing a conductive ink on a partial upper portion of the first conductive pattern by an inkjet process, thereby forming an interlayer conductive layer;
   printing an insulating ink on the insulating substrate and the first conductive pattern along a wiring pattern by an inkjet process, thereby forming an insulating pattern; and
   performing a thermal treatment to harden the insulating ink and fire the conductive ink,
   wherein the height of the insulating pattern is the same as the height of the first conductive pattern or higher than the height of the first conductive pattern, and the insulating ink is a 2-component system consisting of 85-95 wt % of bismaleimide based compound and 5-15 wt % of photo-polymerization initiator.

7. The method of claim 6, further comprising:
   semi-hardening a second insulating pattern after printing the insulating ink on the insulating substrate and the first conductive pattern; and
   repeating forming the first conductive pattern, interlayer conductive layer and insulating pattern more than one time, thereby forming a multi-layered circuit.

8. The method of claim 6, wherein the semi-hardening is performed by ultraviolet (UV) irradiation.

9. The method of claim 8, further comprising performing a drying process before the semi-hardening.

10. The method of claim 6, wherein the insulating ink is a 3-component system consisting of polyamic acid, photo-polymerization initiator, and crosslinking agent.

11. The method of claim 10, wherein the polyamic acid is 50-60 wt %, the crosslinking agent is 21-35 wt %, and the photo-polymerization initiator is 5-29 wt %.

12. The method of claim 6, wherein the conductive pattern is formed of a conductive ink by an inkjet process, and the conductive ink includes at least one metal selected from the group consisting of gold, silver, copper, platinum, chrome, nickel, aluminum, titan, palladium, tin, vanadium, zinc, manganese, cobalt, zirconium, and alloys thereof.

13. The method of claim 6, wherein the thermal treatment is performed at 200-350° C.

14. A printed wiring board manufactured by the method of claim 1.

* * * * *